(12) United States Patent
Chang et al.

(10) Patent No.: US 8,022,426 B2
(45) Date of Patent: Sep. 20, 2011

(54) COLOR MIXING LIGHT EMITTING DIODE DEVICE

(75) Inventors: Chung-Min Chang, HsinChu (TW); Tung-An Chen, HsinChu (TW); Chun-Wei Wang, HsinChu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 238 days.

(21) Appl. No.: 12/429,190

(22) Filed: Apr. 24, 2009

(65) Prior Publication Data

US 2009/0267090 A1   Oct. 29, 2009

(30) Foreign Application Priority Data

Apr. 25, 2008   (CN) .......................... 2008 1 0301320

(51) Int. Cl.
  *H01L 33/00* (2010.01)
(52) U.S. Cl. ................ 257/98; 257/79; 257/88; 257/95; 257/E33.001
(58) Field of Classification Search .................... 257/79, 257/88, 95, 98
See application file for complete search history.

(56) References Cited

U.S. PATENT DOCUMENTS

| 2003/0038295 | A1* | 2/2003 | Koda .............................. 257/98 |
| 2005/0225222 | A1* | 10/2005 | Mazzochette et al. .......... 313/46 |
| 2008/0023721 | A1* | 1/2008 | Lee et al. ......................... 257/99 |
| 2008/0093978 | A1* | 4/2008 | Mori ............................... 313/498 |
| 2008/0308825 | A1* | 12/2008 | Chakraborty et al. .......... 257/98 |

* cited by examiner

*Primary Examiner* — Wai Sing Louie
(74) *Attorney, Agent, or Firm* — Altis Law Group, Inc.

(57) ABSTRACT

An exemplary color mixing light emitting diode (LED) device includes a substrate, LED dies, an encapsulating body, and a light mixing structure. The substrate has a main surface. The LED dies are arranged adjacent the main surface of the substrate. The light mixing structure is arranged adjacent an outer portion of the main surface of the substrate, around the LED dies. The encapsulating body encapsulates the LED dies and the light mixing structure. The light mixing structure is made of light transmissive material, and the light mixing structure has light scattering particles doped therein.

15 Claims, 7 Drawing Sheets

COLOR MIXING LIGHT EMITTING DIODE DEVICE

BACKGROUND

1. Technical Field

The present disclosure generally relates to light emitting diode devices, and particularly to a light emitting diode device mixing light having different wavelengths.

2. Discussion of Related Art

Light emitting diodes (LEDs) have recently been used extensively as light sources for illumination devices due to their high luminous efficiency, low power consumption and long work life. In some LED devices, to satisfy certain illuminating requirements, light mixing is employed. That is, light having different colors or wavelengths is emitted from different light emitting diodes, and such light is mixed to form light of a desired color or wavelength. For example, white light is obtained by mixing light emitted respectively by a red light LED die, a green light LED die, and a blue light LED die. However, these three LED dies cannot be positioned at absolutely the same location in the LED device. As a result, the red, green and blue light may not be mixed completely, and the light output from the LED device may be non-uniform.

Therefore, what is needed is a color mixing light emitting diode device that can overcome the described limitations.

BRIEF DESCRIPTION OF THE DRAWINGS

Many aspects of the disclosed color mixing light emitting diode device can be better understood with reference to the following drawings. The components in the drawings are not necessarily drawn to scale, the emphasis instead being placed upon clearly illustrating the principles of the present color mixing light emitting diode device. Moreover, in the drawings, all the views are schematic, and like reference numerals designate corresponding parts throughout the several views.

DETAILED DESCRIPTION

Reference will now be made to the drawings to describe various embodiments of the present color mixing light emitting diode device, in detail.

Figure 1:
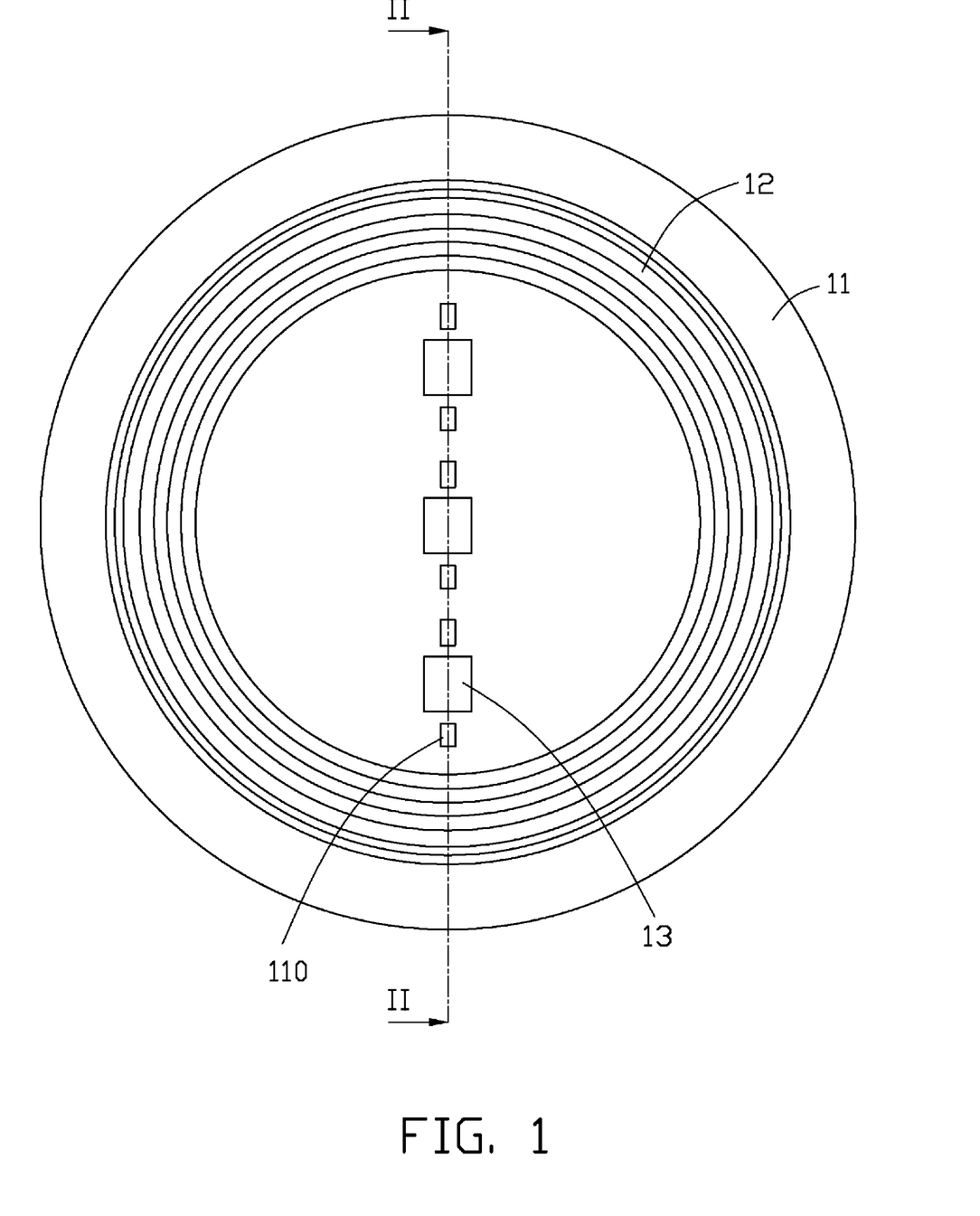
FIG. 1 is a top plan view of a color mixing light emitting diode device, according to a first embodiment.
Figure 2:
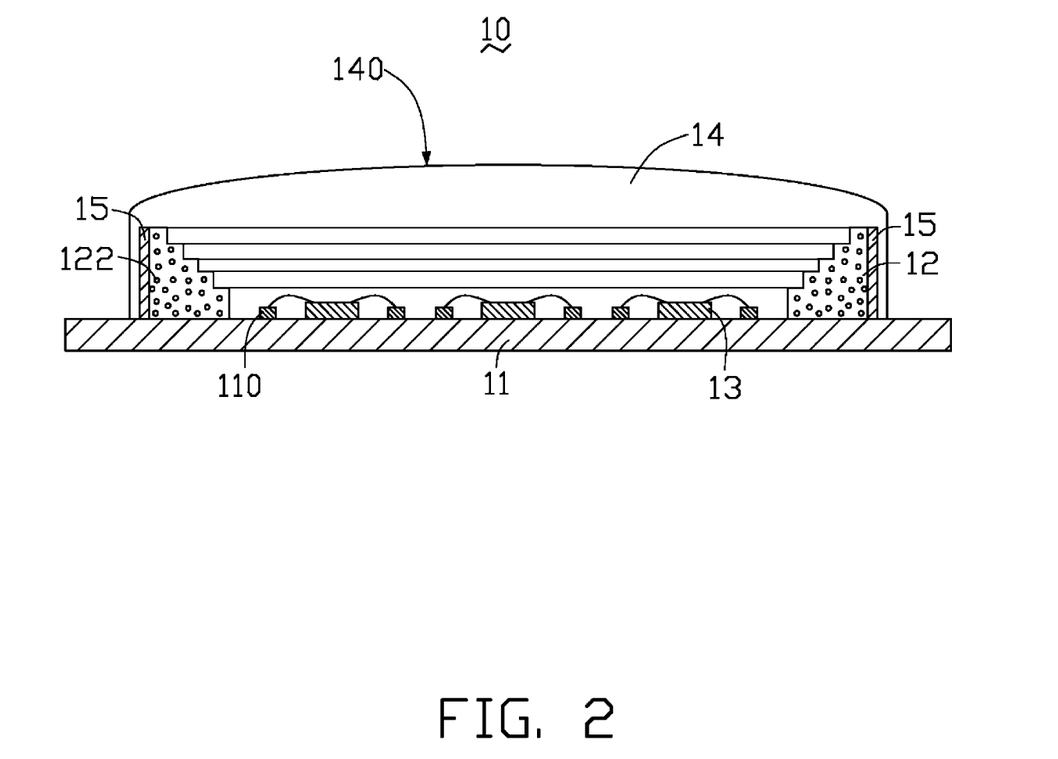
FIG. 2 is a cross-sectional view of the color mixing light emitting diode device of FIG. 1, taken along line II-II thereof.

Referring to FIG. 1 and FIG. 2, a color mixing light emitting diode device 10, according to a first embodiment, includes a substrate 11, a light mixing ring 12, a plurality of light emitting diode (LED) dies 13 and an encapsulating body 14.

The substrate 11 is configured for supporting the light mixing ring 12 and the LED dies 13. The substrate 11 has an electrical layer 110 formed thereon. The substrate 11 can be selected from a group consisting of glass fiber reinforced epoxy (e.g. FR4), a metal core printed circuit board (MCPCB), a ceramic substrate, a silicon substrate, and a ceramic aluminum substrate. In an exemplary embodiment, the substrate 11 is a planar substrate. The electrical layer 110 includes electrically conductive portions.

The light mixing ring 12 is arranged around the LED dies 13. The light mixing ring 12 is made of a light transmissive base material, such as glass, polycarbonate (PC), polymethyl methacrylate (PMMA), silicone, or epoxy resin. The light mixing ring 12 has a plurality of light scattering particles 122 doped therein. The light scattering particles 122 have an index of refraction in a range from 1.1 to 2.4. The light scattering particles 122 can be a material selected from a group consisting of titanium oxide ($TiO_2$), fused silica, polycarbonate (PC), polymethyl methacrylate (PMMA), aluminum oxide ($Al_2O_3$), magnesium oxide (MgO), sialon (a polymer of silicon, aluminum, oxygen, and nitrogen), and transparent (or light transmissive) oxynitride. In an exemplary embodiment, the index of refraction of the light scattering particles 122 is different from that of the base material of the light mixing ring 12. In the illustrated embodiment, the light mixing ring 12 is a single body of material continuously surrounding the LED dies 13, and has a generally annular shape. The light mixing ring 12 includes a stepped inner peripheral wall (not labeled) facing generally towards the LED dies 13.

The LED dies 13 are electrically connected to the electrical layer 110 of the substrate 11 by metal wires (not labeled). At least two of the LED dies 13 have light emitting wavelengths different from each other. The LED dies 13 can be adhered onto the substrate 11 by conductive paste (for example silver paste) or nonconductive paste. Alternatively, the LED dies 13 can be bonded to the substrate 11 by eutectic bonding. In an exemplary embodiment, the color mixing light emitting diode device 10 is for emitting white light. The color mixing light emitting diode device 10 includes three LED dies 13 for respectively emitting blue light with a central wavelength in a range from 440 nanometers to 480 nanometers, green light with a central wavelength in a range from 510 nanometers to 540 nanometers, and red light with a central wavelength in a range from 610 nanometers to 650 nanometers.

The encapsulating body 14 encapsulates the light mixing ring 12 and the LED dies 13. In the present embodiment, the encapsulating body 14 is a continuous, solid mass of material in contact with the light mixing ring 12 and the LED dies 13. The encapsulating body 14 can be made of light transmissive material such as epoxy resin or silicone. The encapsulating body 14 is for preventing the LED dies 13 from being eroded by exterior vapor or contaminants, and enhancing a mechanical strength of the color mixing light emitting diode device 10. In an exemplary embodiment, the encapsulating body 14 has a refraction index between the refraction indexes of the LED dies 13 and the refraction index of the exterior atmosphere (i.e., air with a refraction index of 1). Thereby, a gradational transition of refracting index is formed to improve a light extraction efficiency of the color mixing light emitting diode device 10. In an exemplary embodiment, the encapsulating body 14 has a top surface 140. The top surface 140 is a circular cambered surface, with an exterior convexity of the circular cambered surface facing away from the substrate 11. In other embodiments, the top surface 140 can have other kinds of geometric shapes to satisfy desired light extraction needs. For example, the top surface 140 can be a circular cambered surface with an exterior concavity facing away from the substrate 11. In other examples, the top surface 140 can be a planar surface parallel to the substrate 11, or a generally spherical surface.

The light mixing ring 12 further includes an outer peripheral wall (not labeled). The color mixing light emitting diode device 10 further includes a light reflecting layer 15. The light reflecting layer 15 is provided on the outer wall of the light mixing ring 12. Light emitted by the LED dies 13 can be incident on the inner wall of the light mixing ring 12, pass through the interior and the outer wall of the light mixing ring 12, and then be incident on the light reflecting layer 15. The light reflecting layer 15 is capable of reflecting the incident light back into the interior of the light mixing ring 12. Thereby, the light reflected by the light reflecting layer 15 and other light not reflected by the light reflecting layer 15 is scattered by the light scattering particles 122 and sufficiently mixed in the interior of the light mixing ring 12, and finally output from the light mixing ring 12 through the inner wall thereof. The light reflecting layer 15 is made of material capable of reflecting light beams, such as silver or aluminum.

Figure 3:
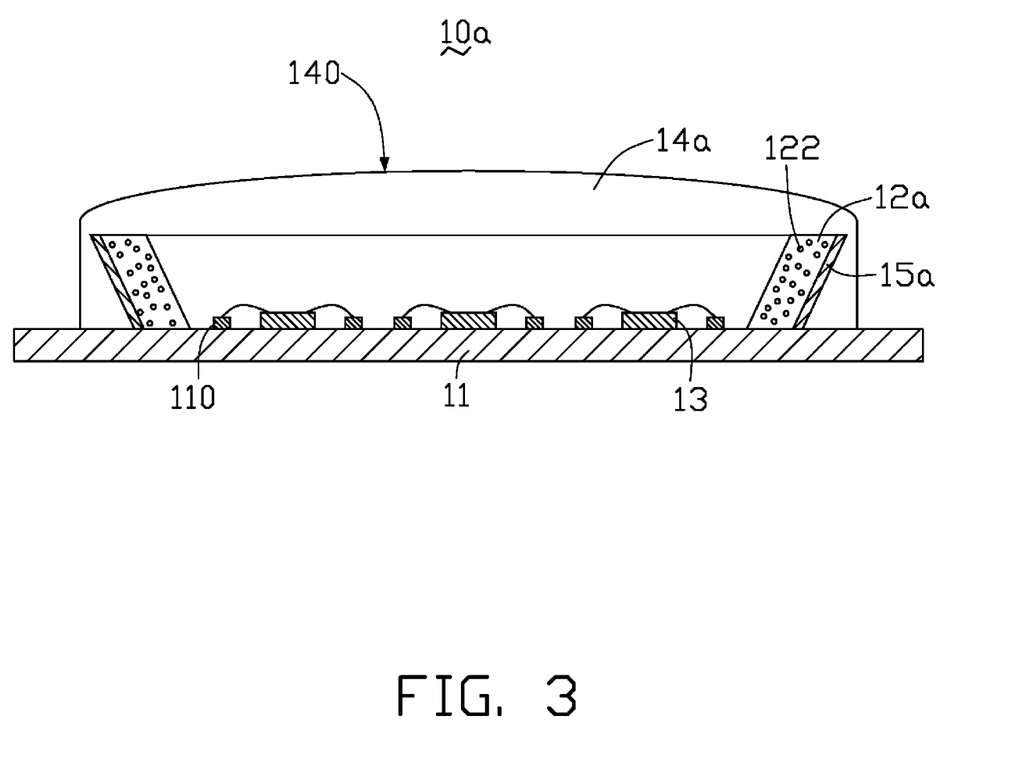
FIG. 3 is a cross-sectional view of a color mixing light emitting diode device according to a variation of the first embodiment.

FIG. 3 shows a color mixing light emitting diode device 10a, according to a variation of the first embodiment. A light mixing ring 12a is generally in the form of an inverted, hollow truncated cone or an inverted, hollow truncated pyramid. Both the outside and the inside of the truncated cone or pyramid taper from a top of the light mixing ring 12a down to the substrate 11. A light reflecting layer 15a is provided on an outer peripheral wall of the light mixing ring 12a. An encapsulating body 14a encapsulates the light mixing ring 12a and the LED dies 13.

Figure 4:
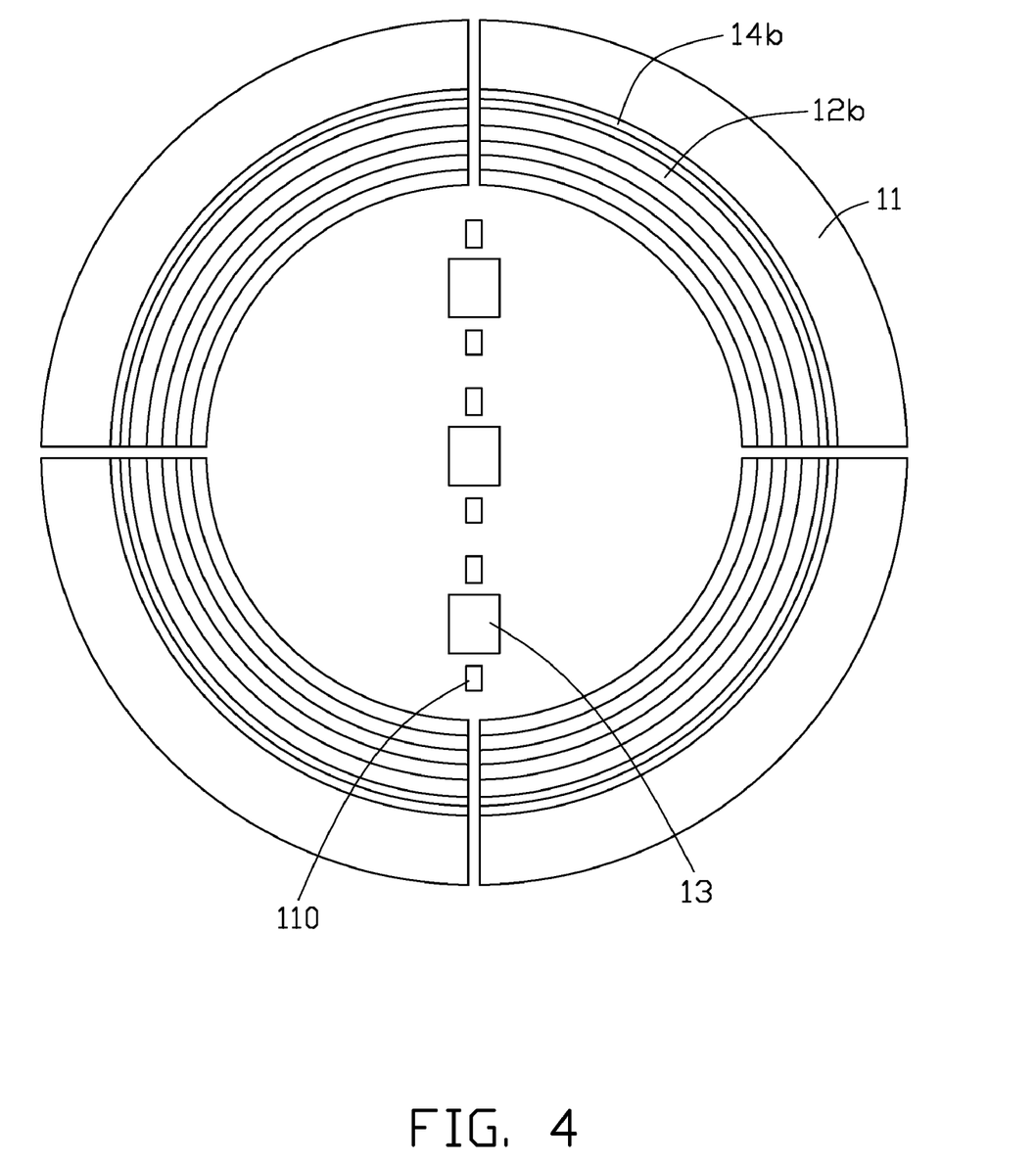
FIG. 4 is a top plan view of a color mixing light emitting diode device according to another variation of the first embodiment.

FIG. 4 shows a color mixing light emitting diode device according to another variation of the first embodiment. A light mixing ring 12b includes four parts, which are separate from each other and which are evenly distributed around the LED dies 13. The four parts have the same size and shape. An encapsulating body 14b encapsulates the light mixing ring 12b and the LED dies 13. In other embodiments, there may be two, three, or more than four parts; and/or the parts may be unevenly arranged around the LED dies 13.

Figure 5:
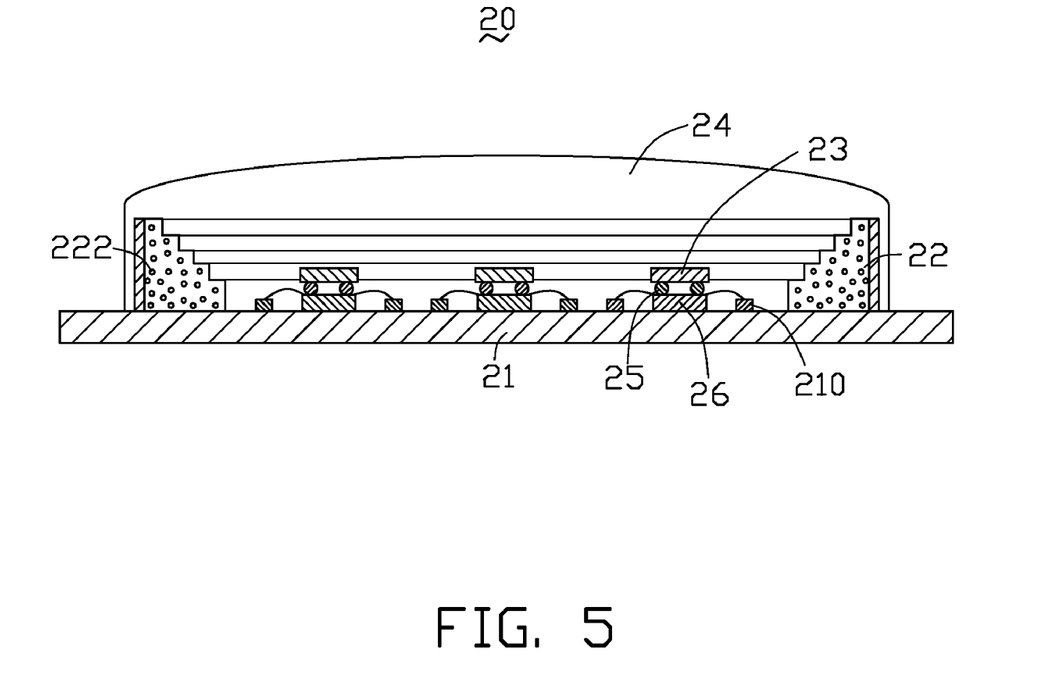
FIG. 5 is a cross-sectional view of a color mixing light emitting diode device, according to a second embodiment.

Referring to FIG. 5, a color mixing light emitting diode device 20, according to a second embodiment, includes a substrate 21, a light mixing ring 22, a plurality of LED dies 23 and an encapsulating body 24. The color mixing light emitting diode device 20 has a configuration similar to that of the color mixing light emitting diode device 10. The main difference is that there is a plurality of islands 26 provided on the substrate 21, with the LED dies 23 being mounted on the islands 26, respectively. In particular, the LED dies 23 are mounted on the islands 26 by metal bumps 25 using flip chip technology, and are then wire bonded to an electrical layer 210 of the substrate 21 to achieve electrical connection.

The color mixing light emitting diode devices 10, 20 are respectively equipped with the light mixing rings 12, 22 which surround the LED dies 13, 23. The light mixing rings 12, 22 have light scattering particles 122, 222 doped therein. Thus, light emitted from the LED dies 13, 23 is incident on the inner walls and enters the interiors of the light mixing rings 12, 22, and is scattered by the light scattering particles 122, 222. In addition, some of the light is reflected by the light reflecting layer, and reenters the light mixing rings 12, 22 and is scattered by the light scattering particles 122, 222. As such, all the light can be sufficiently mixed, and provide excellent uniformity and purity of output light.

Figure 6:
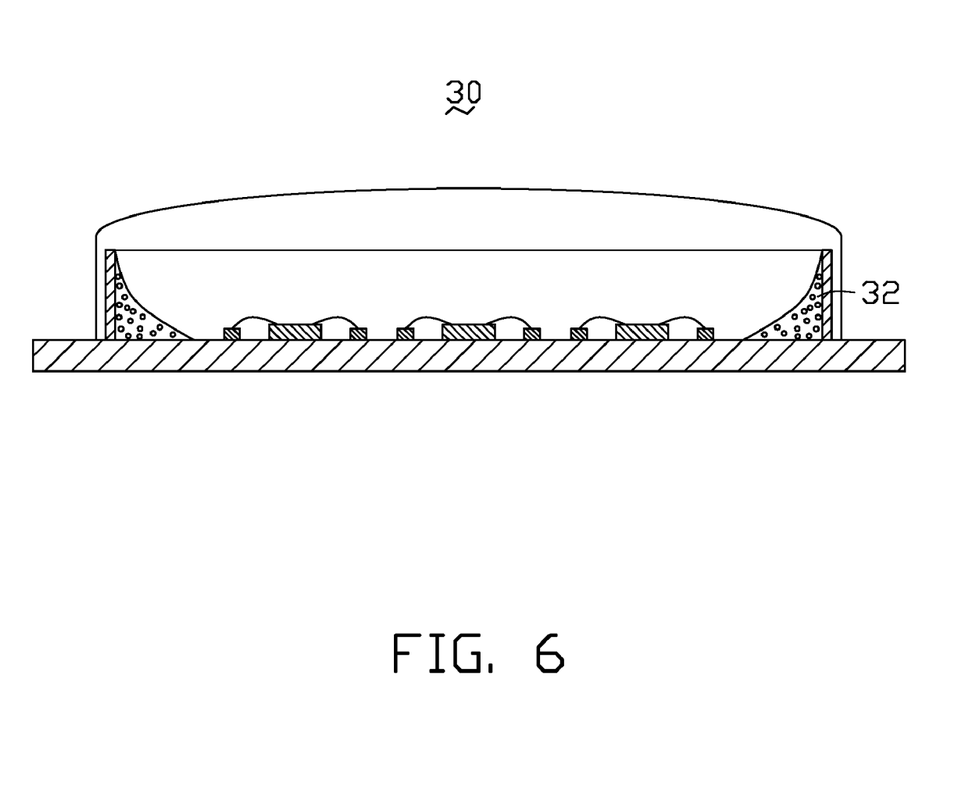
FIG. 6 is a cross-sectional view of a color mixing light emitting diode device, according to a third embodiment.
Figure 7:
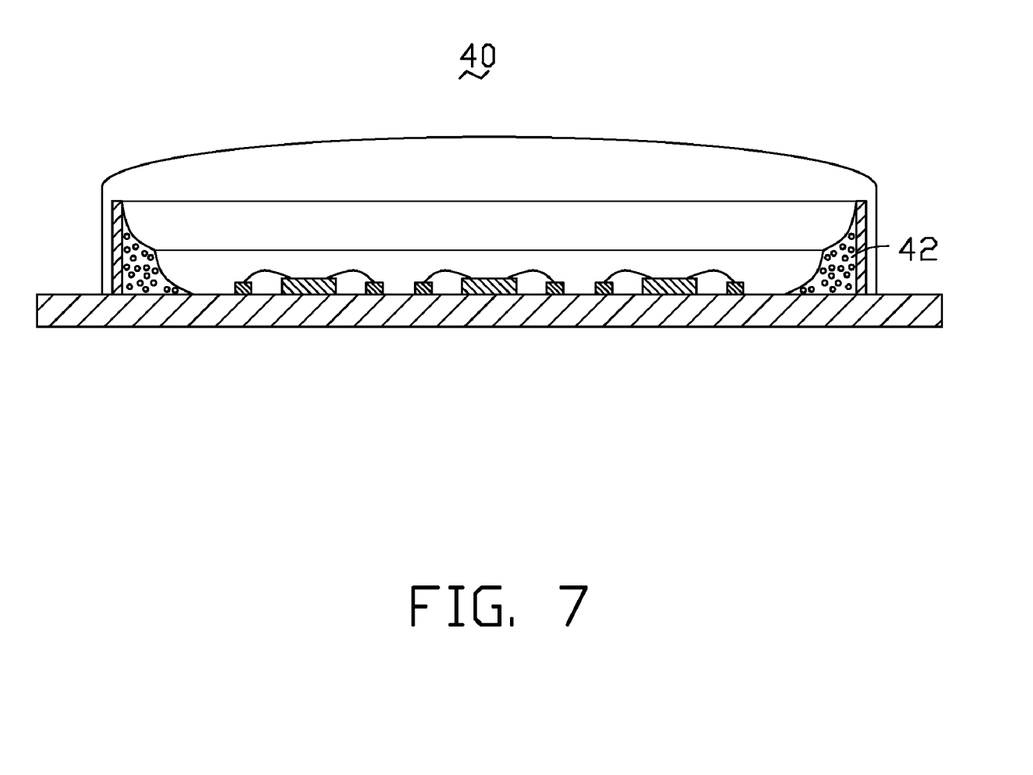
FIG. 7 is a cross-sectional view of a color mixing light emitting diode device, according to a fourth embodiment.

The inner wall of each of the light mixing rings 12, 12b and 22 is stepped, but in other embodiments the inner wall may be other than stepped. Referring to FIG. 6 and FIG. 7, color mixing light emitting diode devices 30, 40 include light mixing rings 32, 42, which have inner walls that are differently shaped. The inner wall of the light mixing ring 32 is a curved surface having a predetermined generally concave curvature. In the illustrated embodiment, a transverse cross-section of any portion of the curved surface is arcuate or arc-shaped. The inner wall of the light mixing ring 42 is a geometric surface comprised of a plurality of curved surfaces, each of which has a predetermined generally concave curvature. In the illustrated embodiment, there are two such curved surfaces. The curvature of the two curved surfaces is the same, although the sizes and positions of the two curved surfaces are different. In the illustrated embodiment, an inner, lower one of the curved surfaces is smaller than an outer, higher one of the curved surfaces. A transverse cross-section of any portion of each curved surface is arcuate or arc-shaped. In other embodiments, the curvature of the two curved surfaces may be different from each other.

Finally, it is to be understood that the above-described embodiments are intended to illustrate rather than limit the disclosure. Variations may be made to the embodiments without departing from the spirit of the invention as claimed. The above-described embodiments illustrate the scope of the disclosure but do not restrict the scope of the disclosure.

What is claimed is:

1. A color mixing light emitting diode (LED) device, comprising:
   a substrate having a main surface;
   a plurality of LED dies arranged adjacent the main surface of the substrate, at least two of the plurality of LED dies having light emitting wavelengths different from each other;
   an encapsulating body; and
   a light mixing structure arranged adjacent an outer portion of the main surface of the substrate around the plurality of LED dies, the light mixing structure comprising a stepped inner peripheral wall facing generally towards the plurality of LED dies, wherein the encapsulating body encapsulates the LED dies and the light mixing structure, the light mixing structure is made of light transmissive material, and the light mixing structure has light scattering particles doped therein.

2. The color mixing LED device according to claim 1, wherein the light transmissive material is selected from the group consisting of glass, polycarbonate, epoxy resin, silicone, and polymethyl methacrylate.

3. The color mixing LED device according to claim 1, wherein the plurality of LED dies are three LED dies configured for respectively emitting red light, green light, and blue light.

4. The color mixing LED device according to claim 1, further comprising a plurality of islands provided on the main surface of the substrate, wherein the LED dies are mounted on the islands, respectively.

5. The color mixing LED device according to claim 1, wherein the light scattering particles have a refraction index in a range from 1.1 to 2.4.

6. The color mixing LED device according to claim 1, wherein the light scattering particles are made of material selected from the group consisting of titanium dioxide, fused silica, polycarbonate, polymethyl methacrylate, aluminium hydroxide, magnesium oxide, silicon-aluminum-oxygen-nitrogen polymer material, and transparent oxynitride.

7. The color mixing LED device according to claim 1, wherein the light transmissive material of the light mixing structure has a refraction index different from that of the light scattering particles.

8. The color mixing LED device according to claim 1, wherein the encapsulating body has a top surface, and the top surface is one of a circular cambered surface with an exterior convexity facing away from the substrate and a circular cambered surface with an exterior concavity facing away from the substrate.

9. The color mixing LED device according to claim 1, wherein the light mixing structure comprises an outer peripheral wall, and the outer peripheral wall has a light reflective layer provided thereon.

10. The color mixing LED device according to claim 1, wherein the light mixing structure is a single body of material continuously surrounding the plurality of LED dies.

11. The color mixing LED device according to claim 10, wherein the light mixing structure has a generally annular shape.

12. The color mixing LED device according to claim 1, wherein the light mixing structure includes a plurality of parts which are separate from each other and which are distributed around the plurality of LED dies.

13. The color mixing LED device according to claim 12, wherein the parts have the same size and shape, and are evenly arranged around the plurality of LED dies.

14. A color mixing light emitting diode (LED) device, comprising:
a substrate having a main surface;
a plurality of LED dies arranged adjacent the main surface of the substrate, at least two of the plurality of LED dies having light emitting wavelengths different from each other;
an encapsulating body; and
a light mixing structure arranged adjacent an outer portion of the main surface of the substrate around the plurality of LED dies, the light mixing structure comprising an inner peripheral wall facing generally towards the plurality of LED dies, the inner wall having a curved surface, and the curved surface having a configuration being one of a generally concave curvature and a geometric surface comprised of a plurality of curved surfaces each of which has a generally concave curvature, wherein the encapsulating body encapsulates the LED dies and the light mixing structure, the light mixing structure is made of light transmissive material, and the light mixing structure has light scattering particles doped therein.

15. The color mixing light emitting diode (LED) device of claim 14, wherein the plurality of LED dies are three LED dies respectively emit blue light, red light and green light.

* * * * *